(12) United States Patent
Kashima et al.

(10) Patent No.: US 6,862,333 B2
(45) Date of Patent: Mar. 1, 2005

(54) CMD AND CMD-CARRYING CCD DEVICE

(75) Inventors: Shunji Kashima, Moriya (JP); Kyoichi Yahata, Sahara (JP); Izumi Kobayashi, Ushiku (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/447,827

(22) Filed: May 29, 2003

(65) Prior Publication Data

US 2003/0223531 A1 Dec. 4, 2003

(30) Foreign Application Priority Data

May 30, 2002 (JP) .................................. 2002-157918

(51) Int. Cl.$^7$ ..................... G11C 19/28; H01L 27/148
(52) U.S. Cl. ..................... 377/60; 377/57; 257/246; 257/236
(58) Field of Search .................... 377/60, 57; 257/246, 257/236

(56) References Cited

U.S. PATENT DOCUMENTS

| | | | |
|---|---|---|---|
| 5,337,340 A | 8/1994 | Hynecek | |
| 6,278,142 B1 | 8/2001 | Hynecek | |
| 6,444,968 B1 * | 9/2002 | Burt et al. | 250/208.1 |
| 2003/0223531 A1 * | 12/2003 | Kashima et al. | 377/57 |

* cited by examiner

Primary Examiner—Mark V. Prenty
(74) Attorney, Agent, or Firm—William B. Kempler; W. James Brady, III; Frederick J. Telecky, Jr.

(57) ABSTRACT

This invention controls the signal amplification rate in a simple way with high precision in a CMD or CMD-carrying CCD device. CMD 12 has plural sections, such as M sections (U1-$U_M$), each of which is a CMD unit U that can perform a charge multiplication operation, set in series. Each section of CMD unit Ui has plural (such as 4) electrodes G1, G2, G3, G4 set in a row via an insulating film, such as silicon oxide film 100, on a silicon insulating film. Among driving voltages P1, P2, P3, P4 applied on the electrodes G1, G2, G3 and G4, P1 and P2 are applied in the same cycle as the transfer clock, P4 for impact ionization is applied in intermittent cycles with respect to P1 and P2, and P3 is applied as a DC voltage at a prescribed level.

20 Claims, 6 Drawing Sheets

CMD AND CMD-CARRYING CCD DEVICE

FIELD OF THE INVENTION

This invention pertains to a CCD (Charge Coupled Device). More specifically, this invention pertains to a CMD (Charge Multiplying Device).

BACKGROUND OF THE INVENTION

It is well known that a CCD is a semiconductor device that can store signal charges near the surface of a semiconductor substrate and transfer said signal charges in succession. On the other hand, a CMD is described in the invention of U.S. Pat. No. 5,337,340 published on Aug. 9, 1994, and it is a semiconductor device that uses a CCD and can realize a charge multiplication or signal amplification function inside the CCD cell.

FIG. 10 is a diagram illustrating the constitution of a CMD. As shown in the figure, as the basic unit of the CMD or CMD unit $U_{CMD}$, a plurality (say, 4) electrodes G1, G2, G3, G4 are set in a row via an insulating film, such as silicon oxide film 100, on a silicon substrate. Driving voltages P1, P2, P3, P4 with phase and cycle relationships shown in FIG. 11 are applied on said electrodes G1, G2, G3, G4, respectively. Among these driving voltages, P1, P2, P4 are applied as pulse voltages for clock operation, and P3 is applied as a DC voltage at a prescribed level. Here, a characteristic feature is that with respect to electrode G4, driving voltage P4 has an H-level voltage ($V_{CMG}$) much higher than other driving voltages P1, P2, P3. As an example, when P1 and P2 are set at an H level of 5 V and L level of −4 V, and P3 is set at 0 V (ground potential), P4 is set at an H level ($V_{CMG}$) of 14 V and L level of 1.5 V.

When driving voltage P2 is at the H level while driving voltage P1 is at the L level, as shown in FIG. 10, the signal charge on the surface of the silicon substrate moves from beneath electrode G1 to beneath electrode G2, and pixel separation barrier 102 with a shallow potential is formed beneath electrode G1, and, at the same time, temporary storage well 104 with a relatively large depth is formed beneath electrode G2. In this case, charge transfer barrier 106 with a potential a little deeper than that of said pixel separation barrier 102 is formed beneath electrode G3.

In this state, when driving voltage P4 is changed from the L level to the H level, charger collection well 108 is formed beneath electrode G4 as a very deep well, with a depth several times that of said temporary storage well 104. Then, when P2 is changed from the H level to the L level right after that, the potential of temporary storage well 104 rises to reach the level indicated by broken line 104'. Then, the signal charge stored in temporary storage well 104 right beneath electrode G2 is drawn through above charge transfer barrier 106 into charge collection well 108 right beneath electrode G4 under a high electric field in the lateral direction, that is, the transfer direction, and it forcibly impacts silicon atoms (Si) in said well 108 to generate secondary electrons of electron-hole pairs. That is, co-called impact ionization takes place. Among the electron-hole pairs generated in said impact ionization, the holes are drawn to the deep portion of the silicon substrate or the nearby electrode, and the electrons are left in charge collection well 108.

In this way, charge multiplication takes place in charge collection well 108. Then, although not shown in the figure, when driving voltage P1 is changed from the L level to the H level, temporary storage well 104 is formed beneath electrode G1. As driving voltage P4 is changed from the H level to the L level right after that, the bottom of charge collection well 108 rises, and it becomes shallower even than temporary storage well 104. As a result, the signal charge moves from charge collection well 108 to beneath electrode G1. After that, the aforementioned operation is carried out repeatedly.

In this way, as driving voltages (pulses) P1, P2, P4 having the same cycle or period and synchronized under a common clock are applied with a prescribed phase difference on corresponding electrodes P1, P2, P4, respectively, in CMD unit $U_{CMD}$, transfer and charge multiplication are performed for a pixel in each cycle.

In the conventional CMD, plural sections of said CMD units $U_{CMD}$ (G1, G2, G3, G4) are set (repeatedly) in the charge transfer direction, and, in each unit $U_{CMD}$, charge multiplication is performed by means of said impact ionization in each cycle. Consequently, the signal charge passing through the CMD is subject to impact ionization (charge multiplication) for the same number of rounds as the number of sections (total number) of CMD units $U_{CMD}$. In said conventional CMD, in order to control the overall signal amplification rate of the CMD, control is performed to change the H level voltage ($V_{CMG}$) of driving voltage P4 as the bias voltage of the charge collection well with respect to electrode G4.

Consequently, as shown in FIG. 12, the charge multiplication rate of the CMD displays a characteristic curve that rises steeply with respect to the bias voltage of charge collection well ($V_{CMG}$), and, in the range where a high amplification rate is obtained, even a small change in the bias voltage ($V_{CMG}$) leads to a significant change in the amplification rate. Consequently, fine control of the signal amplification rate by means of voltage control becomes very hard.

The objective of this invention is to solve the aforementioned problems of the conventional method by providing a type of CMD and a type of CMD-carrying CCD device characterized by the fact that control of the signal amplification rate can be carried out simply and with high precision.

SUMMARY OF INVENTION

In accordance with one aspect of this invention a CMD comprises: plural electrodes are set in a row via an insulating film on a semiconductor substrate; a group of driving voltages with phases different from each other are applied on said plural electrodes; a first-phase driving voltage for generating impact ionization is applied intermittently with respect to the driving voltages in other phases.

In another aspect of this invention, by means of controlling change of the intermittent cycle of the first-phase driving voltage, one can adjust the period or round number of impact ionization for the signal charge transferred on the semiconductor substrate and beneath the electrode row, so that one can freely adjust the charge multiplication rate or signal amplification rate.

In a further aspect of this invention, if the number of cycles for applying said driving voltages in other phases during the period of passage of the signal charge of one pixel from one end to the other end of said plural electrodes is M, and the number of cycles of said driving voltages in other phases contained in 1 cycle of said first-phase driving voltage is N, N is a divisor of M. By meeting this condition, for the signal charges of all pixels passing through the CMD, the same number of rounds of intermittent impact ionization (charge multiplication) are carried out, and it is possible to obtain a uniform signal amplification rate free of dispersion.

In a fourth aspect of the invention, in the signal charge transfer direction, a second electrode is set downstream, adjacent to the first electrode on which said first-phase driving voltage is applied, a third electrode is set downstream, adjacent to said second electrode, and a said first electrode is set downstream, adjacent to said third electrode; a second-phase driving voltage and a third-phase driving voltage are applied on said second electrode and third electrode, respectively, so as to form alternately at a prescribed timing a potential well for temporary storage of a signal charge right beneath each of them and a potential barrier for preventing mixing of signal charges between pixels before and after the phase. In this embodiment, when the first-phase driving voltage with respect to the first electrode becomes an active level while the signal charge moves from beneath the third electrode to beneath the first electrode, impact ionization takes place in the vicinity right beneath the first electrode, and one round of charge multiplication is carried out. Conventional charge transfer takes place between the first electrode and the second electrode, and between the second electrode and the third electrode.

In another aspect of the invention, a fourth electrode is set between said third electrode and said first electrode, and a DC voltage is applied on said fourth electrode to form a potential barrier for charge transfer right beneath it.

In a further aspect of the invention, a cycle number control means may be present that controls the value of N so as to adjust the signal amplification rate, and a driving voltage control means may be present that controls the active voltage level of said first-phase driving voltage so as to adjust the signal amplification rate.

In a seventh aspect of this invention also provides a type of CMD-carrying CCD device has the CCD connected such that signal charge can be transferred directly between the CMD of this invention and the electrode at the input end of said CMD and/or the electrode at the output end.

In an eighth aspect of the invention, the CMD and the CCD directly connected to its former portion and/or latter portion are synchronized with each other, and the signal charge is transferred in the same direction; in the CCD, conventional charge transfer is carried out; in the CMD, the charge transfer operation and the intermittent charge multiplication operation of this invention are carried out.

In a ninth aspect of the invention said CCD has a fifth electrode and sixth electrode, which have said second-phase driving voltage and said third-phase driving voltage applied on them, respectively, set alternately. In this case, in the signal charge transfer direction, a seventh electrode, on which said DC voltage is applied, may be placed between said sixth electrode and said fifth electrode.

In a further aspect of the invention said CCD connected to the input end side of said CMD includes a parallel input/serial output type CCD that has signal charges input in parallel to plural said electrodes and has said input signal charges output in series with said CMD. In this case, it is preferred that a serial input/serial output type CCD may be connected between the output end of said parallel input/ serial output type CCD and the input end of said CMD be contained. In addition, if the number of cycles for applying said second-phase driving voltage and third-phase driving voltage when the signal charge of a pixel passes through said serial input/serial output type CCD is K, K may be a multiple of N.

REFERENCE NUMERALS AND SYMBOLS AS SHOWN IN THE DRAWINGS

In the figures, 10 represents a CMD-carrying CCD device, 12 a CMD, 14, 16 a CCD, 22 a photosensitive portion, 24 a storage portion, 26 a horizontal transfer CCD, 14*a* a parallel input/serial output type CCD, 14*b* a serial input/serial output type CCD, 32 a driver, 34 a timing circuit, and G1, G2, G3, G4 an electrode.

DESCRIPTION OF THE EMBODIMENTS

In the following, preferable embodiments of this invention will be explained with reference to FIGS. 1–9.

Figure 1:
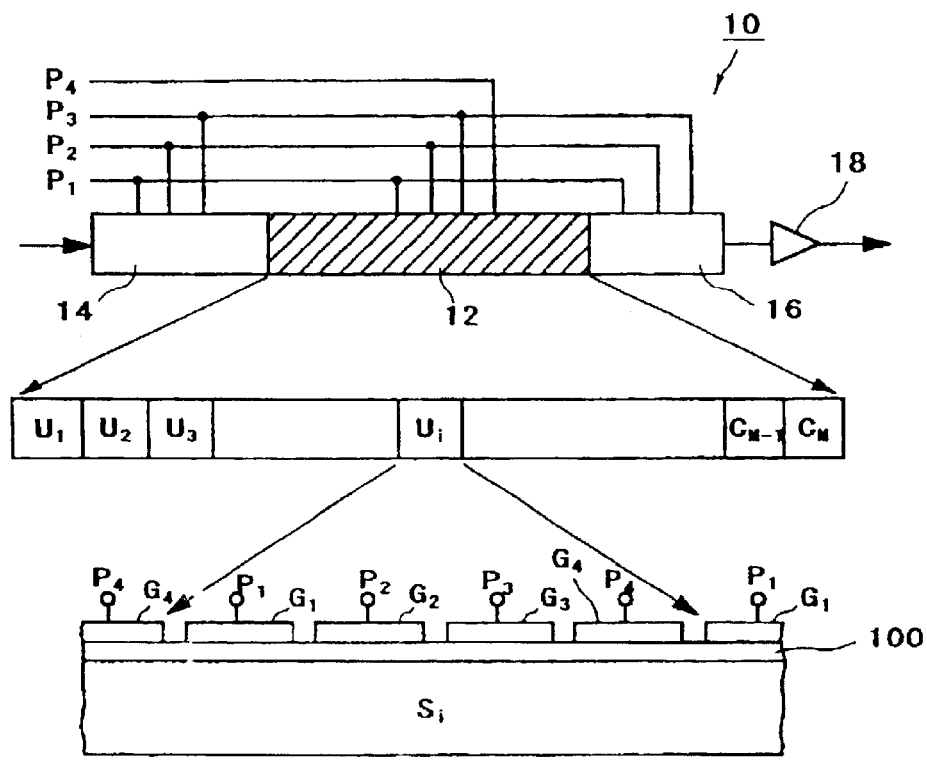
FIG. 1 is a schematic diagram illustrating the basic constitution of the CMD-carrying CCD device in an embodiment of this invention.

FIG. 1 is a diagram illustrating the basic constitution of the CMD-carrying CCD device in an embodiment of this invention. As shown in the figure, this CMD-carrying CCD device 10 has a CCD 14, 16 connected in series to the former portion (input side) and/or latter portion (output side) of CMD 12. In this case, CMD 12 and CCD 14, 16 may be formed in the same process on a single or common semiconductor substrate. On the surface of the substrate, the signal charge is transferred directly from beneath the electrode on the output end of former-portion CCD 14 to beneath the electrode on the input end of CMD 12, and the signal charge is directly transferred from beneath the electrode of the output end of CMD 12 to beneath the electrode on the input end of latter-portion CCD 16. On the output end of latter-portion CCD 16, an output portion is set for converting the signal charge to an electric signal. The electric signal output from said output portion is amplified with amplifier 18 and is output. For former-portion CCD 14, the input signal or charge is not limited to a serial input form, it is also possible to adopt a parallel input form. Also, for latter-portion CCD 16, the output signal or charge is not limited to a serial output form, it is also possible to adopt a parallel output form.

Figure 10:
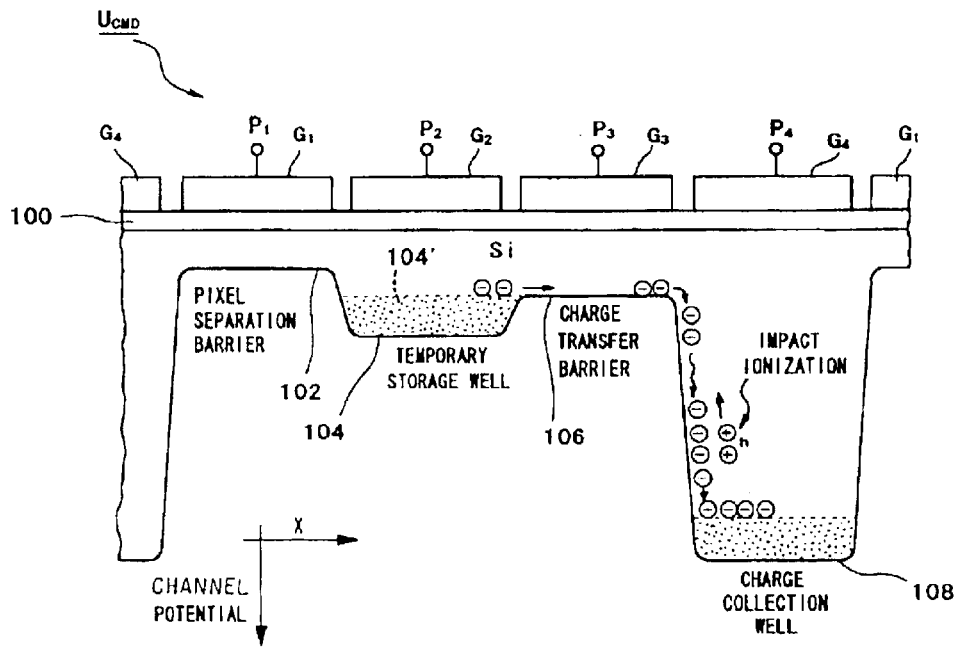
FIG. 10 is a cross section illustrating schematically the principle of a CMD.
Figure 11:
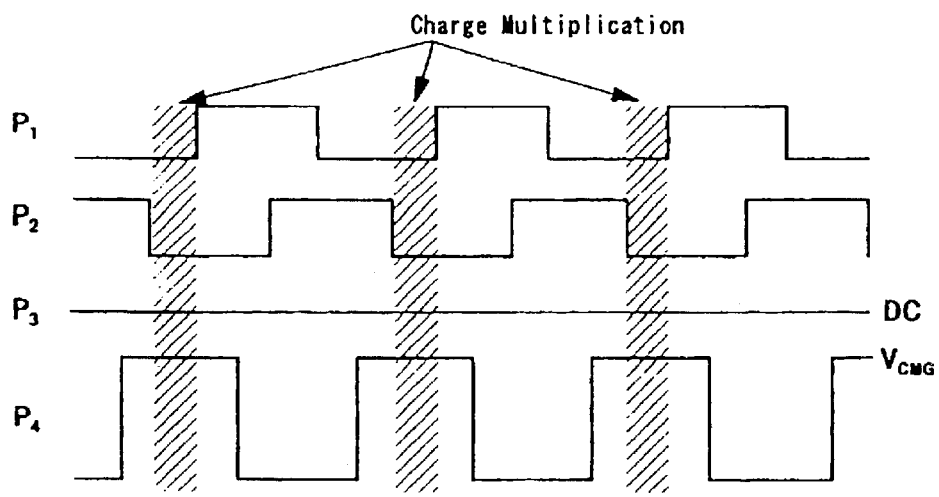
FIG. 11 is a signal waveform diagram illustrating the timing (phase and cycle) of the driving voltage in a conventional CMD.
Figure 12:
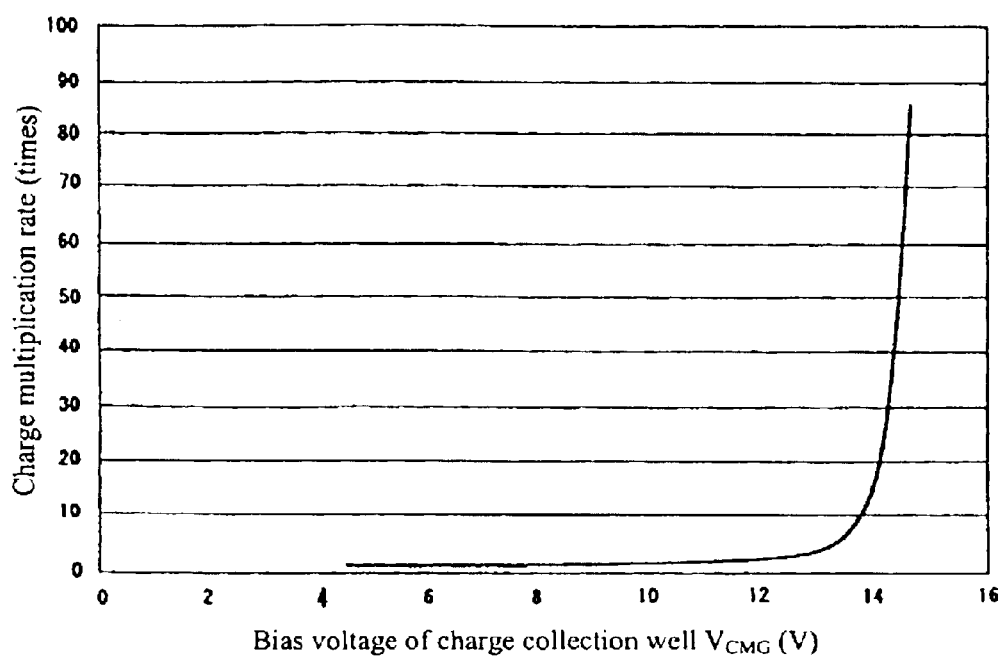
FIG. 12 is a diagram illustrating the characteristics of the charge multiplication rate with respect to the bias voltage of the charge collection well in a CMD.

CMD 12 has plural sections of CMD units U, such as M units (U1-U$_M$), which can perform charge multiplication operation in each unit, connected in series. Each CMD unit Ui may have the same constitution as that of unit U$_{CMD}$ shown in FIG. 10, that is, with plural (say, 4) electrodes G1, G2, G3, G4 set in a row via an insulating film, such as silicon oxide film 100, on a silicon substrate.

Figure 2:
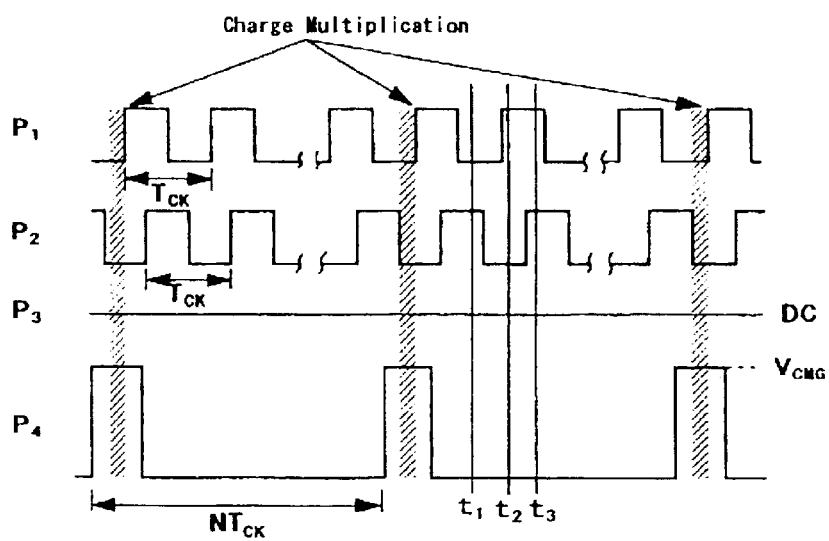
FIG. 2 is a signal waveform diagram illustrating the relationship of timing (phase and cycle) of the driving voltage in the CMD-carrying CCD device in this embodiment.

In an embodiment of this invention, driving voltages P1, P2, P3, P4 having the timing relationship (for phases and cycles) shown in FIG. 2 are applied on said electrodes G1, G2, G3, G4, respectively. Among these driving voltages, P1, P2, P4 are applied as pulse voltages of clock operation, and P3 is applied as a DC voltage at a prescribed level. Driving voltages P1 and P2 have phase difference such that a 1-pixel signal charge is transferred in each cycle for a unit. The H level (V$_{CMG}$) of driving voltage P4 with respect to electrode G4 for impact ionization is set at a voltage level significantly higher than that of other driving voltages P1, P2, P3. For example, when P1 and P2 are set at an H level of 5 V and L level of −4 V, and P3 is set at 0 V (ground potential), P4 may be set at an H level (V$_{CMG}$) of 14 V and L level of 1.5 V.

A characteristic feature of this embodiment is that driving voltage P4 applied on electrode G4 for impact ionization is applied intermittently with respect to driving voltages P1, P2 in other phases. That is, if the time of one cycle (period) of the transfer clock is Tck, while one cycle of driving voltages P1, P2 is Tck, one cycle of driving voltage P4 is NTck (N is 2 or a larger integer).

Consequently, in each section of CMD units Ui, in only one cycle among N cycles, charge multiplication is carried out by means of impact ionization as explained above with reference to FIG. 10, and in all of the remaining cycles among said N cycles, charge multiplication of impact ionization is not carried out, and a conventional charge transfer operation, that is, CCD transfer operation, is carried out.

In this embodiment, for example, at times t1, t2, t3 shown in FIG. 2, CCD transfer operation is carried out in CMD units Ui of various sections. In the following, the function of said CCD transfer operation will be explained with reference to FIGS. 3–5.

Figure 3:
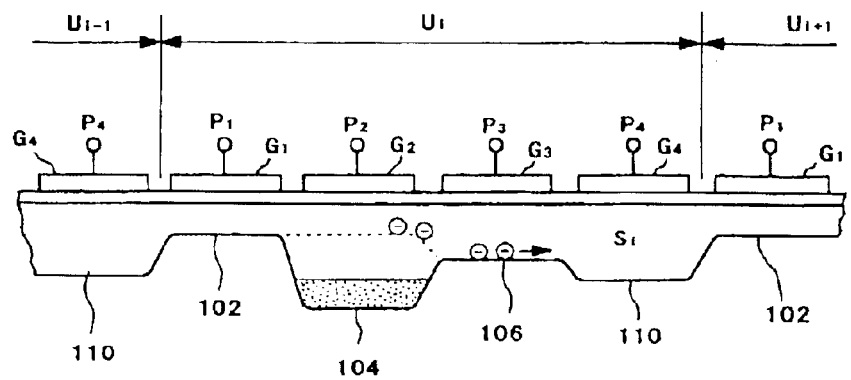
FIG. 3 is a schematic cross section illustrating a step of the CCD transfer operation in the CMD-carrying CCD device in the embodiment.

In FIG. 2, at time t1, P1 is at the L level, P2 is at the H level, and P4 is at the L level. In this case, as shown in FIG. 3, on the silicon substrate surface, temporary storage well 104 with a relatively deep potential is formed beneath electrode G2, and the signal charge that has just moved from beneath electrode G1 is temporarily stored in said well 104. Pixel separation barrier 102 with a shallow potential is formed beneath electrode G1. Charge transfer barrier 106 with a potential a little deeper than that of pixel separation barrier 102 is formed beneath electrode G3. Charge transfer well or buffer 110 with a potential a little deeper than that of charge transfer barrier 106 is formed beneath electrode G4.

In this state, when driving voltage P2 is changed from the H level to the L level, the bottom of temporary storage well 104 beneath electrode G2 rises to the level indicated by broken line 104', and the signal charge stored in said well 104 goes over pixel separation barrier 106 and moves to the side of charge transfer buffer 110 beneath electrode G4.

Figure 4:
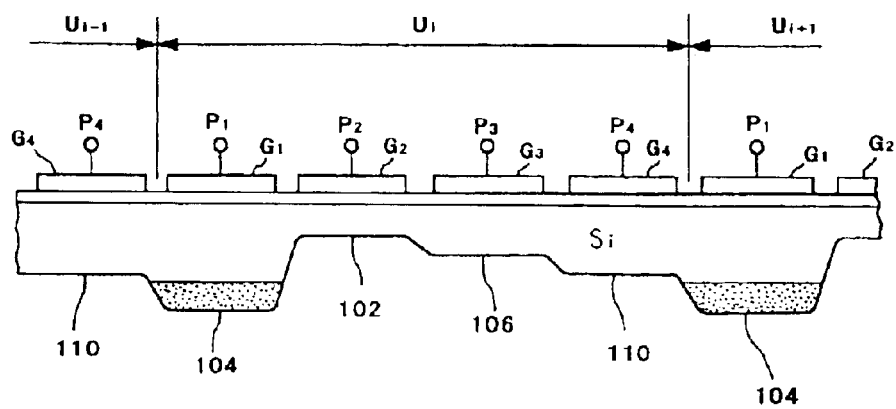
FIG. 4 is a schematic diagram illustrating a step of the CCD transfer operation in the CMD-carrying CCD device in the embodiment.

Then, driving voltage P1 changes from the L level to the H level. At time t2, as shown in FIG. 4, on the surface of the silicon substrate, temporary storage well 104 is formed beneath electrode G1, and the signal charge that has moved here through charge transfer buffer 110 right beneath electrode G4 is stored in said temporary storage well 104. Also, the signal charge moves from charge transfer buffer 110 right beneath electrode G4 of said CMD unit Ui to temporary storage well 104 right beneath electrode G1 of CMD unit Ui+1 as the downstream side neighbor. On the other hand, the signal charge from charge transfer buffer 110 right beneath electrode G4 of CMD unit UI−1 as the upstream side neighbor (the signal charge corresponding to the following pixel) moves to temporary storage well 104 right beneath electrode G1 of said CMD unit Ui.

Figure 5:
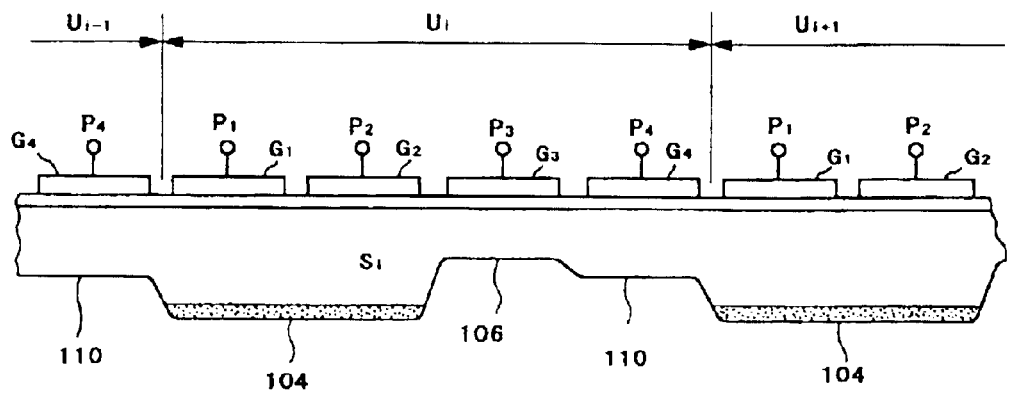
FIG. 5 is schematic diagram illustrating a step of the CCD transfer operation in the CMD-carrying CCD device in the embodiment.

Then, driving voltage P2 changes from the L level to the H level, and, at time t3, as shown in FIG. 5, on the surface of the silicon substrate, temporary storage well 104 is formed not only beneath electrode G1, but also extending beneath electrode G2, and the signal charge in said extended temporary storage well 104 diffuses and moves beneath electrode G2.

Then, when driving voltage P1 changes from the H level to the L level, potentials of the various portions on the surface of the silicon substrate become the same as those in FIG. 3, and the signal charge is locally stored in temporary storage well 104 right beneath electrode G2. After that, while driving voltage P4 is in the disable state (L level), the same CCD transfer operation as aforementioned is carried out repeatedly in the various cycles of the transfer clock.

In this way, during the period when driving voltage P4 is temporarily absent, that is, during the period of (N−1) cycles of the transfer clock, signal charges of (N−1) pixels merely pass in a CCD transfer operation of CMD units Ui of the various sections without subject to charge multiplication with impact ionization.

As far as the signal charges of the various pixels are concerned, as they pass through M sections of unit row U1-U$_M$ in CMD 12, they are subject to charge multiplication with impact ionization only in units U that are (N−1) units apart. Consequently, by changing the value of N, that is, the number of intermittent cycles of driving voltage P4, the number of rounds of impact ionization (charge multiplication) in CMD 12 is controlled, and one can thus freely adjust the overall charge multiplication rate or signal amplification rate of CMD 12.

In this embodiment, a preferable condition is that intermittent cycle number N of driving voltage P4 for impact ionization is selected as a divisor of section number M of CMD units U included in CMD 12. Here, section number M of CMD units U in CMD 12 is also the number of cycles of application of driving voltages P1, P2 during the period of passage of the signal charge of one pixel through CMD 12.

Consequently, for example, if M is 400, N may be set at any of the following divisors of 400, that is, 2, 4, 5, 8, 10 . . . By meeting such a numerical condition, it is possible to amplify the signal charges of all pixels passing through CMD 12 at a uniform charge multiplication rate.

Figure 6:
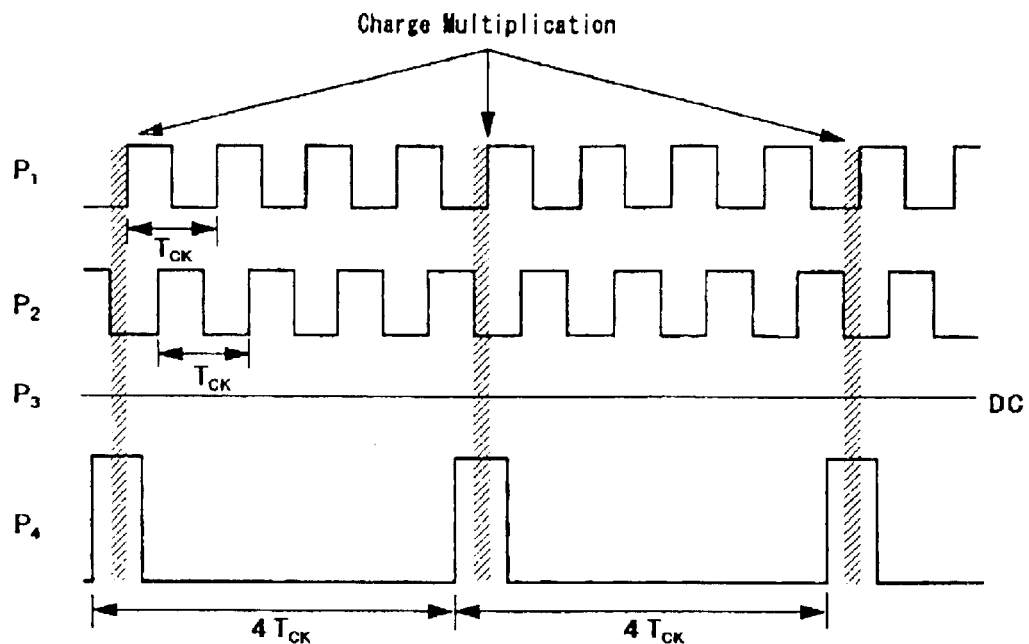
FIG. 6 is a signal waveform diagram illustrating the relationship of timing (phase and cycle) of the driving voltage in the CMD-carrying CCD device in the embodiment.
Figure 7:
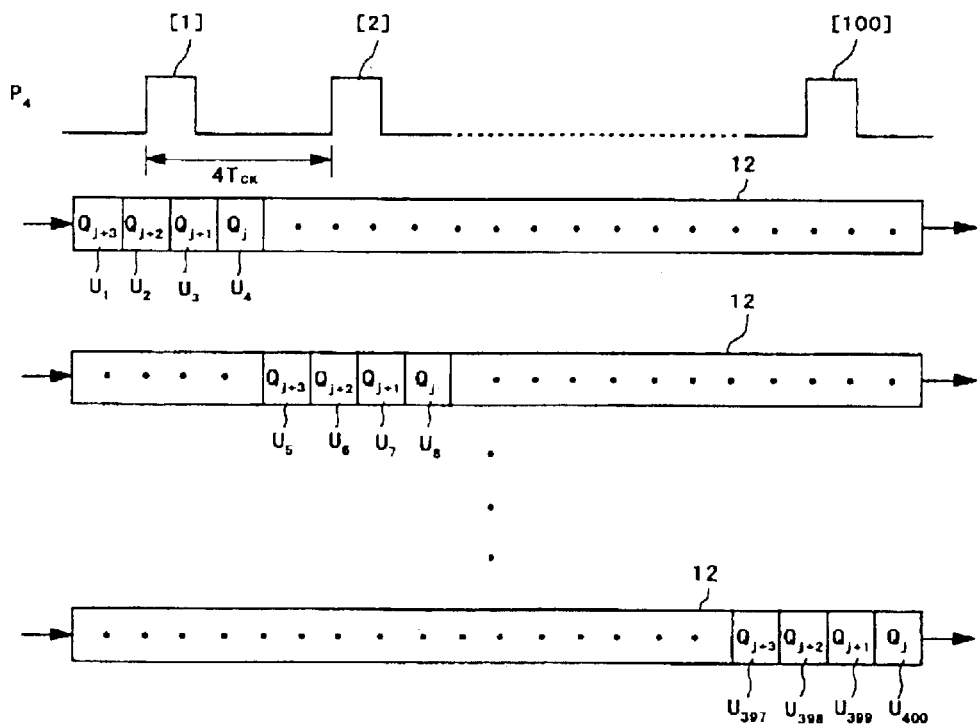
FIG. 7 is a diagram illustrating the number of rounds of intermittent charge multiplication operation in the CMD-carrying CCD device in the embodiment.

In the following, operation will be described with respect to the case with M=400 and N=4 as shown in FIGS. 6 and 7. As can be seen from the timing diagram shown in FIG. 6, when N is set at 4, in CMD units Ui of the various sections, charge multiplication is carried out by means of impact ionization in 4 cycle periods (4 Tck).

As shown in FIG. 7, when driving voltage P4 becomes the first round of H level at a certain time point, signal charges Qj, Qj+1, Qj+2, Qj+3 are positioned in the four units U4, U3, U2, U1 of the former end portion of CMD 12, respectively. As a result, these signal charges Qj, Qj+1, Qj+2, Qj+3 are subject to charge multiplication with impact ionization in units U4, U3, U2, and U1, respectively.

After said impact ionization, in each clock cycle, by means of CCD transfer, signal charges Qj, Qj+1, Qj+2, Qj+3 each move downstream by one unit to the neighboring unit U, respectively. After 4 cycles, signal charges Qj, Qj+1, Qj+2, Qj+3 reach units U8, U7, U6, U5 positioned four units ahead of the position where impact ionization in the last round has been performed, respectively. At this time, driving voltage P4 becomes the second round of H level. As a result, signal charges Qj, Qj+1, Qj+2, Qj+3 are subject to charge multiplication with impact ionization in units U8, U7, U6, U5, respectively.

After that, the aforementioned operation is carried out repeatedly. After 400 cycles of time since input of signal charge Qj into head unit U1, signal charges Qj, Qj+1, Qj+2, Qj+3 reach rear-end-portion units U400, U399, U398, U397, respectively, and driving voltage P4 reaches the $100^{th}$-round H level. As a result, signal charges Qj, Qj+1, Qj+2, Qj+3 are subject to charge multiplication due to impact ionization in U400, U399, U398, U397, respectively.

Each of the four signal charges Qj, Qj+1, Qj+2, Qj+3 is subject to impact ionization (charge multiplication) of a total of 100 rounds during the period when it passes through 400 sections of CMD units U1-U400. In summary, during the period of passage of 400 sections of CMD units U1-U400, each signal charge Q input to CMD 12 is subject to a total of 100 rounds of impact ionization (charge multiplication) 3 sections or 3 cycles apart in one of the following four patterns: [U1, U5, U9, . . . U397], [U2, U6, U10, . . . U398], [U3, U7, U11, . . . U399], and [U4, U8, U12, . . . U400].

In the aforementioned example, N is selected to be 4. On the other hand, when N is selected to be 5, when each input signal charge Q passes through CMD 12, that is, during the period when it passes through 400 sections of CMD units U1-U400, it is subject to a total of 80 rounds of impact ionization (charge multiplication) 4 sections or 4 cycles apart. Also, when N is selected to be 8, when each input signal charge Q passes through CMD 12, it is subject to a total of 50 rounds of impact ionization (charge multiplication) 7 sections or 7 cycles apart.

In this way, in CMD 12 of this embodiment, by means of control for changing under the condition that intermittent cycle number N of driving voltage P4 is selected as a divisor of total number M of CMD units U, all signal charges Q passing through CMD 12 are subject to charge multiplication with impact ionization in the same number of rounds (M/N). Consequently, it is possible to ensure a uniform charge multiplication rate free of dispersion, and it is possible to control changing of the overall signal amplification rate of CMD 12 at high precision. This indicates that in this embodiment, total number M of CMD units U is not only a number having divisors, but also should be a number having many divisors, such as said number "400."

Also, the active level ($V_{CMG}$) of driving voltage P4 may be fixed at a prescribed level (preferably near the maximum value). As crude adjustment of the signal amplification rate, the active level ($V_{CMG}$) of driving voltage P4 is changed under control, and, in this embodiment, a method in which control of the intermittent cycle number of driving voltage P4 is used in fine adjustment of the signal amplification rate is also effective.

In CCD 14, 16 set in the former section and/or latter section of CMD 12 shown in FIG. 1, although not shown in the figure, plural sections of transfer dedicated units, that is, CCD units, made of electrodes G1, G2, G3 are formed via oxide film 100 on a silicon substrate. The same driving voltages P1, P2, P3 as those for electrodes G1, G2, G3 of CMD 12 are applied on said electrodes G1, G2, G3, respectively. As shown in FIG. 2, when driving voltages P1, P2, P3, P4 are applied on said CMD-carrying CCD device 10, while said CCD transfer operation and intermittent charge multiplication operation are performed in CMD 12, in CCD 14, 16, a conventional charge transfer operation or CCD transfer operation is carried out continuously, with the signal charge of one pixel transferred for 1 section of the CCD unit in each cycle.

Figure 8:
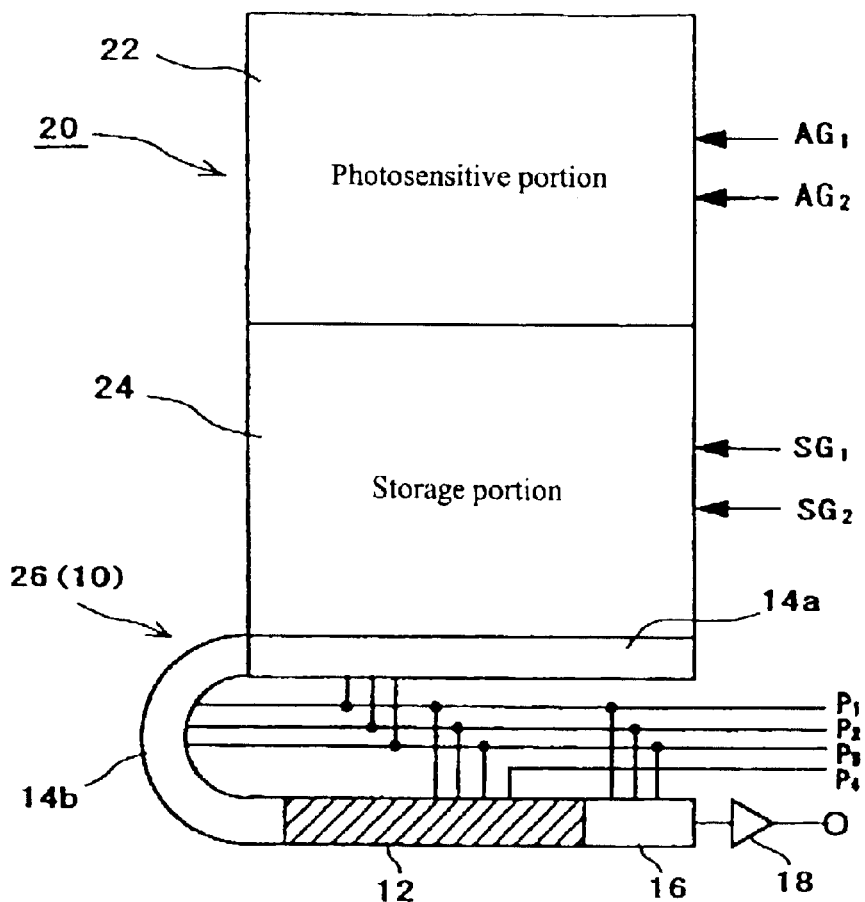
FIG. 8 is a schematic diagram illustrating the constitution of the CCD pickup device in the embodiment.
Figure 9:
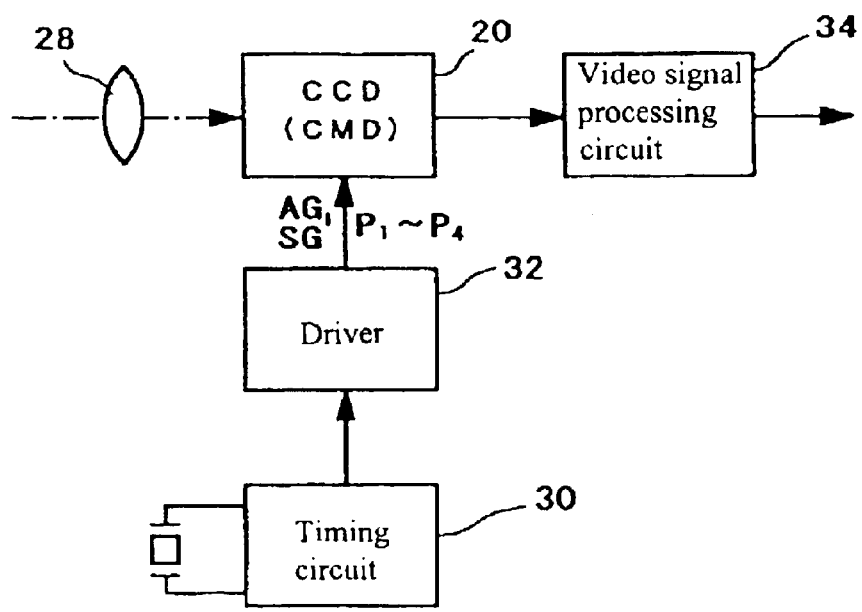
FIG. 9 is a block diagram illustrating the peripheral circuit of the CCD pickup device shown in FIG. 9.

FIG. 8 is a schematic diagram illustrating the constitution of the CCD pickup device as an embodiment of the CMD-carrying CCD device of this embodiment. FIG. 9 is a diagram illustrating an example of the peripheral circuit of said CCD pickup device 20. This CCD pickup device 20 is part of the so-called frame transfer system. It has photosensitive portion 22, storage portion 24, and horizontal transfer CCD 26.

In photosensitive portion 22, plural photoelectric conversion elements corresponding to the pixels of a frame are set in a matrix configuration. The optical image formed through pickup lens 28 on the light receiving plane is converted to a charge image by means of photoelectric conversion of said photoelectric conversion elements. The signal charges of all pixels generated and stored in said photosensitive portion 22 are soon vertically transferred to storage portion 24 at a prescribed timing. Then, the signal charges are vertically transferred to horizontal transfer CCD 26 for each horizontal line from storage portion 24. In horizontal transfer CCD 26, the signal charges are horizontally transferred for each horizontal line, and the electric signal (video signal) is output from the output portion.

The video signal output from said CCD pickup device 20 is subject to a prescribed signal processing in video signal processing circuit 34, and this is sent to a display output device or video signal recording device (not shown in the figure). Under control of timing circuit 30, driver 32 sends the driving voltages (AG1, AG2), (SG1, SG2) for vertical transfer to photosensitive portion 22 and storage portion 24 of CCD pickup device 20.

In this CCD pickup device 20, CMD-carrying CCD device 10 of this embodiment can be used in horizontal transfer CCD 26. Driver 32 sends driving voltages P1, P2, P3, P4 for horizontal transfer and charge multiplication to horizontal transfer CCD 26 {10}. Driver 32 has the function of controlling change in intermittent cycle number N of driving voltage P4 in this embodiment. Also, it may have the function of adjustment of levels of driving voltages P1, P2, P3, P4, especially the function for controlling change in the active level ($V_{CMG}$) of P4.

In horizontal transfer CCD 26 {10}, CCD 14 set in the former section of CMD 12 is divided into parallel input/serial output type CCD 14a directly connected to storage portion 24 and serial input/serial output type CCD 14b that forms a transfer redundant portion between said parallel input/serial output type CCD 14a and CMD 12. The signal charge for 1 horizontal line is vertically transferred from storage portion 24 to CCD 14a in parallel input form, and, from said CCD portion 14a, it is read as a video signal from amplifier 18 through redundant portions CCD 14b, CMD 12 in the serial direction, that is, the horizontal direction, and redundant portion CCD 16 on the output side. As explained above, in CCDs 14a, 14b, 16, only a CCD transfer operation is carried out, and in CMD 12, a CCD transfer operation and intermittent charge multiplication operation are carried out.

In said CCD pickup device 20, in order to increase the horizontal read rate, during the period when the signal charge of a horizontal line is within the range of redundant portion CCD 14b, CMD 12 and redundant portion CCD 16, the horizontal transfer operation is paused (that is, the supply of driving voltages P1–P4 is interrupted), and during the pause of the horizontal transfer operation, the signal charge of the next 1 horizontal line is vertically and parallelly transferred from storage portion 24 to CCD 14a. At this time, the signal charge staying in redundant portion CCD 16 on the latter section side is amplified by CMD 12 to desired or full charge multiplication rate. Also, the signal charge staying in CCD 12 is amplified to a half-way or middle charge multiplication rate corresponding to the entry position. The signal charge staying in redundant portion CCD 14b on the former section side is not subject to charge multiplication.

After parallel transfer of the signal charge of 1 horizontal line from storage portion 24 to CCD 14a as explained above, the horizontal transfer operation is re-started. That is, while the signal charge of 1 horizontal line is sent in series from CCD 14a, the signal charge of the previous 1 horizontal line remaining in redundant portion CCD 14b, CMD 12 and redundant portion CCD 16 starts moving to the output side. The signal charge, for which transfer is re-started from a half-way position in CMD 12 is subject to impact ionization (charge multiplication) (N–1) sections apart in remaining CMD units for a remaining number of rounds corresponding to the position of re-start of transfer. As a result, impact ionization (charge multiplication) is performed for a prescribed number of rounds (M/N) during the period from entry to CMD 12 to exit, so that amplification to the desired or full charge multiplication rate occurs.

The preferable condition for pause/re-start of the horizontal transfer operation as aforementioned is that the timing or phase of driving voltages P1, P2, P4 of the clock operation are continuous during pause and re-start. When this condition is met, even for a signal charge that takes place at pause/re-start of horizontal transfer at any position in CMD 12, the same charge multiplication rate can be realized as for a signal charge that would pass through CMD 12 without pause of transfer.

Also, in order to eliminate dispersion in the signal amplification rate in CMD 12 for each horizontal line, it is preferred that the signal charge of each horizontal line be input to CMD 12 at the same timing or phase. In order to meet this condition, if the number of sections of CCD units in redundant portion CCD 14b, that is, the number of cycles of application of driving voltages P1, P2 during passage of the 1-pixel signal charge through redundant portion CCD 14b, is K, K should be a multiple of N (intermittent cycle number of driving voltage P4). For example, when M=400 and N=4, K is set at 100.

For CCD pickup device 20 in this embodiment, by carrying CMD 12 of this embodiment in horizontal transfer CCD 26, it is possible to amplify all signal charges generated in photosensitive portion 22 at the same amplification rate. Also, as needed, CMD 12 of this embodiment may be carried in the CCD inside photosensitive portion 22 or storage portion 24.

Also, CMD 12 and CMD-carrying CCD 10 in this embodiment are not limited to the CCD pickup device of a frame transfer system. They may also be used in CCD pickup devices of an inter-line transfer system or another system, as well as in image processing devices other than pickup devices.

CMD 12 and CMD-carrying CCD 10 in the aforementioned embodiment are merely an example. Various modifications can be made within the range of the technical idea of this invention. For example, in said embodiment, the basic unit of CMD 12, that is, unit $U_{CMD}$, is composed of four electrodes G1, G2, G3, G4. However, it is possible to omit electrode G3 for forming steady charge transfer barrier 106 by means of DC voltage P3, and to form CMD unit $U_{CMD}$ from electrodes G1, G2, G4 in clock operation under driving voltages P1, P2, P4. Also, various modifications may be made for the constitution relationship among electrodes G1, G2, G3, G4. For example, it is also possible to adopt a constitution in which the adjacent electrodes overlap in the vertical direction.

As explained above, for the CMD or CMD-carrying CCD device of this invention, it is possible to control the signal amplification rate in a simple way at high precision.

What is claimed is:

1. A CMD (Charge Multiplying Device) comprising:
   plural electrodes set in a row via an insulating film on a semiconductor substrate;
   a group of driving voltages with phases different from each other applied on the plural electrodes;
   a first-phase driving voltage for generating impact ionization applied intermittently with respect to the driving voltages in other phases.

2. The CMD described in claim 1 wherein the number of cycles for applying the driving voltages in other phases during the period of passage of the signal charge of one pixel from one end to the other end of the plural electrodes is M, and the number of cycles of the driving voltages in other phases contained in 1 cycle of the first-phase driving voltage is N, N is a divisor of M.

3. The CMD described in claim 1 wherein the signal charge transfer direction, a second electrode is set adjacent on the downstream side of the first electrode on which the first-phase driving voltage is applied, a third electrode is set adjacent on the downstream side of the second electrode, and a the first electrode is set adjacent on the downstream side of the third electrode; a second-phase driving voltage and a third-phase driving voltage are applied on the second electrode and third electrode, respectively, so as to form alternately at a prescribed timing a potential well for temporary storage of signal charge beneath each of them and a potential barrier for preventing mixing of signal charges between pixels before and after the phase.

4. The CMD described in claim 3 further comprising a fourth electrode set between the third electrode and the first electrode, and a DC voltage is applied on the fourth electrode to form a potential barrier for charge transfer beneath it.

5. The CMD described in claim 2 further comprising a cycle number control means that controls change in the value of N so as to adjust the signal amplification rate.

6. The CMD described in claim 1 further comprising a driving voltage control means that controls change in an active voltage level of said first-phase driving voltage so as to adjust the signal amplification rate.

7. A CMD-carrying CCD device comprising a CCD (Charge Coupled Device) connected such that the signal charge can be transferred directly between the CMD described in claim 1 and the electrode at the input end of the CMD and the electrode at the output end.

8. The CMD-carrying CCD device described in claim 7 wherein the CCD has a fifth electrode and sixth electrode, which have the second-phase driving voltage and the third-phase driving voltage applied thereto, respectively, set alternately.

9. The CMD-carrying CCD device described in claim 8 wherein the signal charge transfer direction, said CCD has a seventh electrode, on which the DC voltage is applied, between the sixth electrode and the fifth electrode.

10. The CMD-carrying CCD device described in claim 1 wherein the CCD connected to an input end side of said CMD includes a parallel input/serial output type CCD that has signal charges input in parallel to plural electrodes and has the input signal charges output in series to the CMD.

11. The CMD-carrying CCD device described in claim 10 wherein the CCD connected to the input end side of the CMD includes a serial input/serial output type CCD connected between the output end of the parallel input/serial output type CCD and the input end of the CMD.

12. The CMD-carrying CCD device described in claim 11 wherein the number of cycles for applying the second-phase driving voltage and third-phase driving voltage when the signal charge of a pixel passes through the serial input/serial output type CCD is K, K is a multiple of N.

13. The CMD described in claim 2 wherein the signal charge transfer direction, a second electrode is set adjacent on the downstream side of the first electrode on which the first-phase driving voltage is applied, a third electrode is set adjacent on the downstream side of the second electrode, and a the first electrode is set adjacent on the downstream side of the third electrode; a second-phase driving voltage and a third-phase driving voltage are applied on the second electrode and third electrode, respectively, so as to form alternately at a prescribed timing a potential well for temporary storage of signal charge beneath each of them and a potential barrier for preventing mixing of signal charges between pixels before and after the phase.

14. The CMD described in claim 3 further comprising a cycle number control means that controls change in the value of N so as to adjust the signal amplification rate.

15. The CMD described in claim 4 further comprising a cycle number control means that controls change in the value of N so as to adjust the signal amplification rate.

16. A CMD-carrying CCD device comprising a CCD (Charge Coupled Device) connected such that the signal charge can be transferred directly between the CMD described in claim 2 and the electrode at the input end of the CMD and/or the electrode at the output end.

17. A CMD-carrying CCD device comprising a CCD (Charge Coupled Device) connected such that the signal charge can be transferred directly between the CMD described in claim 3 and the electrode at the input end of the CMD and/or the electrode at the output end.

18. A CMD-carrying CCD device comprising a CCD (Charge Coupled Device) connected such that the signal charge can be transferred directly between the CMD described in claim 4 and the electrode at the input end of the CMD and/or the electrode at the output end.

19. The CMD-carrying CCD device described of claim 8 wherein the CCD connected to an input end side of the CMD includes a parallel input/serial output type CCD that has signal charges input in parallel to plural the electrodes and has the input signal charges output in series to the CMD.

20. The CMD-carrying CCD device described of claim 9 wherein the CCD connected to an input end side of the CMD includes a parallel input/serial output type CCD that has signal charges input in parallel to plural the electrodes and has the input signal charges output in series to the CMD.

* * * * *